United States Patent
Lee

(10) Patent No.: US 6,531,394 B1
(45) Date of Patent: Mar. 11, 2003

(54) METHOD FOR FORMING GATE ELECTRODE OF SEMICONDUCTOR DEVICE

(75) Inventor: Byung Hak Lee, Chungcheongbuk-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 36 days.

(21) Appl. No.: 09/722,820

(22) Filed: Nov. 28, 2000

(30) Foreign Application Priority Data

Jul. 21, 2000 (KR) ........................ 2000/41987

(51) Int. Cl.⁷ ...................... H01L 21/44; H01L 21/3205
(52) U.S. Cl. .................. 438/659; 438/591; 438/592; 438/608; 438/595; 438/655; 438/665
(58) Field of Search ................ 438/592, 591, 438/595, 655, 665, 608, 609

(56) References Cited

U.S. PATENT DOCUMENTS

| | | | | |
|---|---|---|---|---|
| 4,897,368 A | * | 1/1990 | Kobushi et al. | 438/592 |
| 5,034,791 A | * | 7/1991 | Kameyama et al. | 257/332 |
| 5,933,741 A | | 8/1999 | Tseng | 438/305 |
| 6,124,217 A | * | 9/2000 | Sun et al. | 438/778 |
| 6,162,692 A | * | 12/2000 | Gardner et al. | 438/301 |
| 6,171,917 B1 | * | 1/2001 | Sun et al. | 438/305 |
| 6,207,580 B1 | * | 3/2001 | Costaganna | 438/712 |
| 6,222,216 B1 | * | 4/2001 | Rao et al. | 257/296 |
| 6,245,629 B1 | * | 6/2001 | Tobben | 438/386 |
| 6,274,441 B1 | * | 8/2001 | Mandelman et al. | 438/286 |
| 6,284,634 B1 | * | 9/2001 | Rha | 438/592 |
| 6,297,530 B1 | * | 10/2001 | Akatsu et al. | 257/327 |
| 6,323,519 B1 | * | 11/2001 | Gardner et al. | 257/336 |
| 6,329,271 B1 | * | 12/2001 | Akatsu et al. | 438/526 |
| 6,340,627 B1 | * | 1/2002 | Pan | 438/585 |
| 6,362,086 B2 | * | 3/2002 | Weimer et al. | 438/591 |
| 6,436,775 B2 | * | 8/2002 | Kim et al. | 438/301 |

FOREIGN PATENT DOCUMENTS

| JP | 411111841 A | * | 4/1999 |
|---|---|---|---|
| JP | 02000091579 A | * | 3/2000 |
| JP | 02000232076 A | * | 8/2000 |

* cited by examiner

*Primary Examiner*—Caridad Everhart
*Assistant Examiner*—Chuong Anh Luu
(74) *Attorney, Agent, or Firm*—Birch, Stewart, Kolasch & Birch, LLP

(57) ABSTRACT

A method for forming a gate electrode of a semiconductor device, which improves thermal stability of a tungsten/polysilicon structure. The method for forming a gate electrode of a semiconductor device includes: sequentially forming a first insulating film, a polysilicon layer and a tungsten layer on a semiconductor substrate; adding oxygen to the tungsten layer; forming a second insulating film on the tungsten layer to which oxygen is added; and selectively removing the second insulating film, the tungsten layer, the polysilicon layer and the first insulating film to form a gate electrode.

14 Claims, 3 Drawing Sheets

METHOD FOR FORMING GATE ELECTRODE OF SEMICONDUCTOR DEVICE

BACKGROUND OF THE INVENTION

1. Field of the Invention

The present invention relates to a method for fabricating a semiconductor device, and more particularly, to a method for forming a gate electrode of a semiconductor device which improves thermal stability of a tungsten/polysilicon structure.

2. Background of Related Art

Generally, in order to reduce gate resistance in a process for forming a gate electrode of a semiconductor device, tungsten(W) having specific resistance order lower than $WSi_x$ is deposited on a polysilicon so that a gate electrode is formed. When tungsten is reacted with silicon at a temperature of 600° C. or greater, a silicide is formed. Accordingly, $WN_x$ is formed as a diffusion barrier layer between tungsten and silicon to form a gate electrode having $W/WN_x/$polysilicon structure.

A related art method for forming a gate electrode of a semiconductor device will be described with reference to the accompanying drawings.

FIGS. 1a to 1d are sectional views of process steps showing a related art method for forming a gate electrode of a semiconductor device.

As shown in FIG. 1a, field oxide films 12 are formed in a semiconductor substrate 11 at predetermined intervals, and then the field oxide films 12 are divided into an isolation region and an active region.

A first insulating film 13 for a gate oxide film is formed on the active region at a thickness of about 40 Å by thermal oxidation method.

As shown in FIG. 1b, a polysilicon layer 14 is formed on an entire surface of the semiconductor substrate 11 at a thickness of about 1000 Å by low pressure chemical vapor deposition (LPCVD). N+ ions or P+ ions are then implanted into the polysilicon layer 14. When the N+ ions or P+ ions are implanted into the polysilicon layer 14, the polysilicon layer 14 is masked by a photoresist according to devices to be formed, so that the ions are implanted into a specific desired portion of the polysilicon layer 14.

Subsequently, the polysilicon layer 14 is annealed for ten minutes at a temperature of 800° C. so that the implanted impurity ions (N+ or P+) are activated.

As shown in FIG. 1c, the semiconductor substrate 11 is subsequently washed by an HF solution and then a $WN_x$ layer 15 is formed at a thickness of about 50 Å. A tungsten layer 16 is formed on the $WN_x$ layer 15 at a thickness of about 400 Å and a second insulating film 17 is formed on the tungsten layer 16 at a thickness of about 2000 Å.

Here, the $WN_x$ 15 is used as a diffusion barrier between the 153 tungsten layer 16 and the polysilicon layer 14. $WN_x$ and TiN are generally used as the diffusion barrier layer. At present, $WN_x$ is more frequently used as the diffusion barrier layer. This is because the grain size of tungsten is remarkably reduced, thereby increasing the resistance of pure tungsten two times or more than a W/Si structure in a case where tungsten is deposited on TiN by a sputtering method. This is also because TiN is oxidized during selective oxidation of silicon.

As shown in FIG. 1d, a photoresist (not shown) is deposited on the second insulating film 17 and then patterned by an exposure and developing processes to define a gate electrode region. The second insulating film 17, the tungsten layer 16, the $WN_x$ layer 15, the polysilicon layer 14 and the first insulating film 13 are selectively removed using the patterned photoresist as a mask to form a gate electrode 18.

Subsequently, the sides of the gate electrode 18 are selectively oxidized to form a third insulating film on the entire surface including the gate electrode 18. The third insulating film is then etched back to form insulating film sidewalls 19 at both sides of the gate electrode 18.

However, the related art method for fabricating a semiconductor device has several problems.

The diffusion barrier layer, $WN_x$ decomposes into W and $N_2$ at a temperature of 800° C. or greater. Thus, a silicide may be formed at the boundary between the $WN_x$ and polysilicon 14. In this case, $WN_x$ fails to act as a diffusion barrier at a temperature of 800° C. or greater, thereby reducing thermal stability of the structure in a high temperature process.

Furthermore, if $WN_x$ contains more than 10% nitrogen, the $WN_x$ is decomposed into W and $N_2$, thereby forming pores in a grain boundary. As a result, when etching a gate, polysilicon is locally over-etched. This may degrade characteristics of the device.

SUMMARY OF THE INVENTION

Accordingly, the present invention is directed to a method for forming a gate electrode of a semiconductor device that substantially obviates one or more of the problems due to limitations and disadvantages of the related art.

An object of the present invention is to provide a method for forming a gate electrode of a semiconductor device in which a tungsten/polysilicon structure having excellent thermal stability and no pores is obtained.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for forming a gate electrode of a semiconductor device according to the present invention includes: forming a first insulating film, a polysilicon layer and a tungsten layer on a semiconductor substrate; adding oxygen to the tungsten layer; forming a second insulating film on the tungsten layer to which oxygen is added; and selectively removing the second insulating film, the tungsten layer, the polysilicon layer and the first insulating film to form a gate electrode.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

FIGS. 2a to 2d are sectional views of process steps showing a method for forming a gate electrode of a semiconductor device according to the present invention.

Figure 1A:
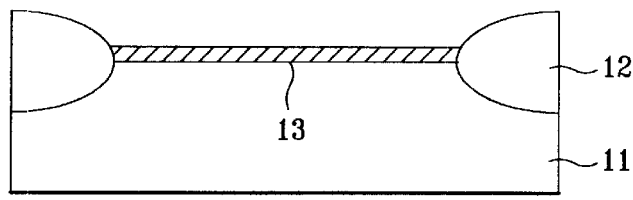
FIGS. 1a to 1d are sectional views of process steps showing a related art method for forming a gate electrode of a semiconductor device.
Figure 1B:
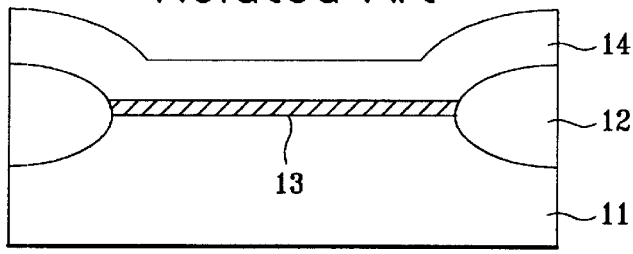
Figure 1C:
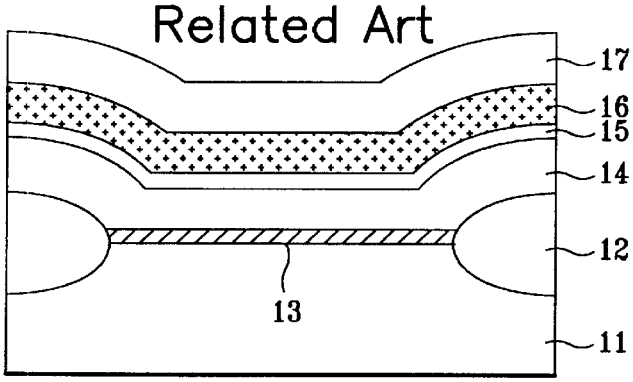
Figure 1D:
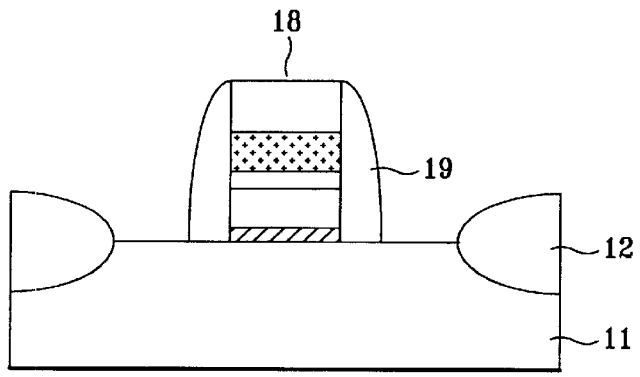
Figure 2A:
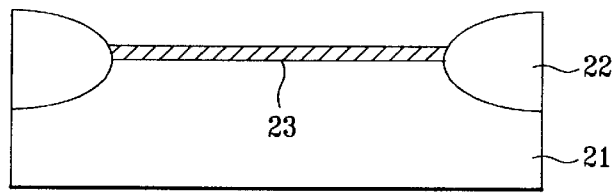
FIGS. 2a to 2d are sectional views of process steps showing a method for forming a gate electrode of a semiconductor device according to the present invention.

As shown in FIG. 2a, field oxide films 22 are formed in a semiconductor substrate 21 at predetermined intervals. The field oxide films 22 separate an isolation region and an active region.

A first insulating film 23 for a gate oxide film is formed on the active region at a thickness of 30~80 Å by, for example, a thermal oxidation method. A polysilicon layer 24 is then formed over first insulating film 23 to a thickness of 700–1000 Å.

Figure 2B:
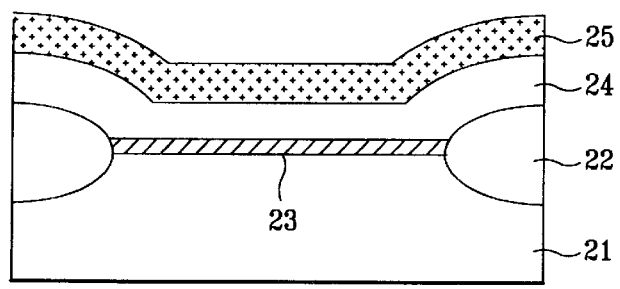
Figure 2C:
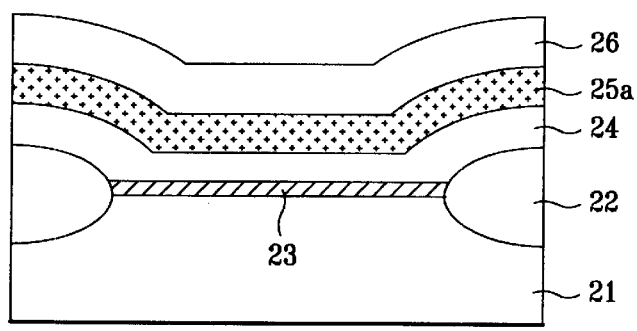

As shown in FIGS. 2b and 2c, a tungsten layer 25 is formed on the polysilicon layer 24 at a thickness of 500~1000 Å. Tungsten layer 25 is then annealed in an ambient of $H_2O/H_2$ to implant oxygen(O) into the tungsten layer 25. Thus, an O-doped tungsten layer 25a is formed. In this case, a voltage dividing ratio of $H_2O/H_2$ is $10^{-6}$~1 and its process temperature is 600~1000° C.

In the process of adding O to the tungsten layer 25, $N_2$ and $NH_3$ may be added to $H_2O/H_2$ as ambient gases.

Furthermore, instead of adding O by performing an annealing process in the ambient of $H_2O/H_2$, O and N of a small amount may be added to the tungsten layer 25 to form a beta-W type tungsten layer.

Subsequently, a second insulating film 26 is formed on the O-doped tungsten layer 25a.

Figure 2D:
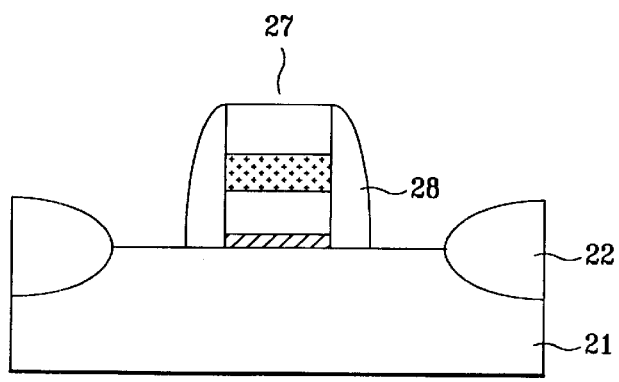

As shown in FIG. 2d, a photoresist layer (not shown) is deposited on the second insulating film 26 and is patterned by exposure and developing processes to define a gate electrode region. The second insulating film 26, the O-doped tungsten layer 25a, the polysilicon layer 24, and the first insulating film 23 are selectively removed using the patterned photoresist as a mask to form a gate electrode 27.

Subsequently, selective oxidation process is performed for 1~60 minutes at a temperature of 800~10000° C. in an ambient of $H_2O/H_2$. In this case, a voltage dividing ratio of $H_2O/H_2$ is $10^{-6}$~1, and argon gas and $N_2$ gas may be used as carrier gases.

Afterwards, a third insulating film is formed on the entire surface including the gate electrode 27. The third insulating film is then etched back to form insulating film sidewalls 28 on sides of the gate electrode 27.

Gate resistance of the gate electrode formed according to the embodiment of the present invention will be described with reference to FIG. 3.

Figure 3:
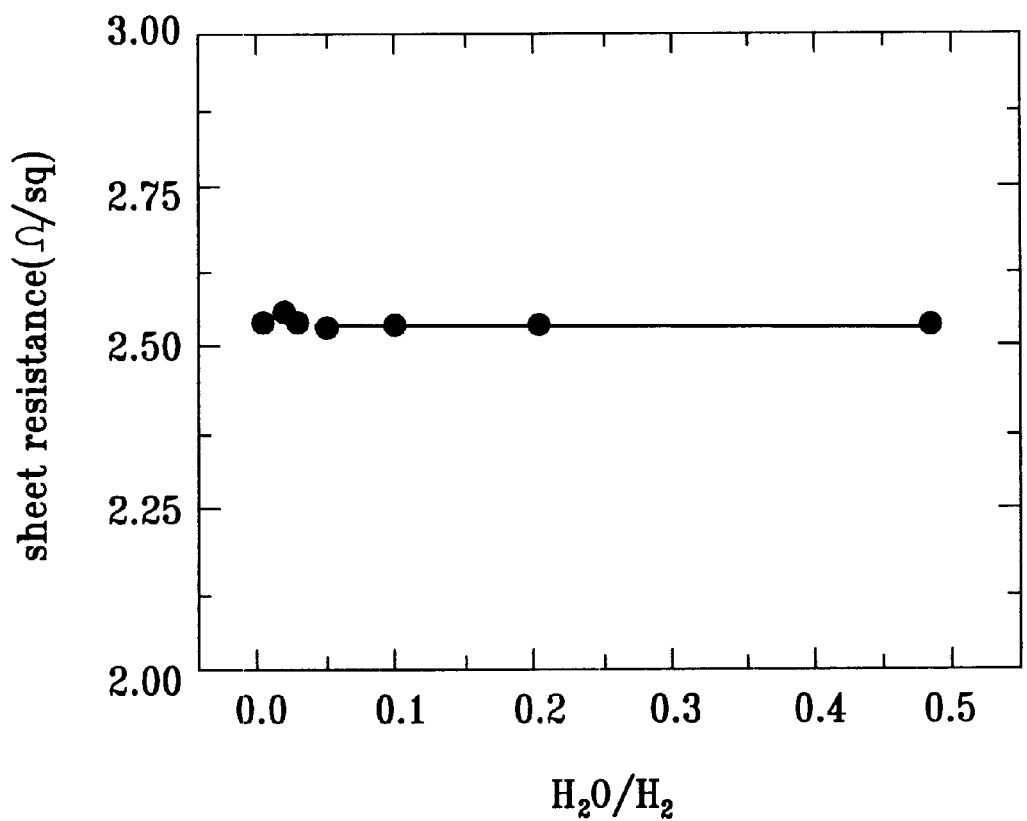
FIG. 3 is a graph showing sheet resistance according to a voltage dividing ratio of $H_2O/H_2$.

FIG. 3 is a graph showing sheet resistance according to a voltage dividing ratio of $H_2O/H_2$, in which annealing was performed at a temperature of 600~10000° C. at the ambient of $H_2O/H_2$ having a voltage dividing ratio of $10^{-6}$~1.

Referring to FIG. 3, a rapid increase of the resistance due to oxidation does not occur. Accordingly, it is understood that sheet resistance becomes almost uniform.

A main feature of the present invention is to form the O-doped tungsten layer 25 by adding O to the tungsten layer, instead of forming $WN_x$ as a diffusion barrier layer. At this time, O is added to the tungsten layer because it is possible to inhibit formation of silicide by a small amount of oxygen contained in a metal thin film (see J. Appl. Phys. 69(1), p213(1991)).

In a method for forming a gate electrode of a semiconductor device according to another embodiment of the present invention, methods for forming an O-doped tungsten layer by adding O to a tungsten layer will be described below. $O_2$ gas of 5% or less concentration may be added to Ar gas during the sputtering of tungsten so that a small amount of oxygen is distributed in the tungsten layer. Alternatively, O may be added to a tungsten layer through $O_2$ plasma after the tungsten layer is formed. Further, O may be added to a tungsten layer by O ion implantation after the tungsten layer is formed.

As aforementioned, the method for forming a gate electrode of a semiconductor device according to the present invention has various advantages.

First, it is possible to inhibit formation of silicide generated when annealing is performed at a temperature of 800° C. or greater by depositing O on the tungsten layer. Thus, it is possible to ensure thermal stability.

Second, since O is doped in the tungsten layer instead of the diffusion barrier layer, pores generated by decomposition of $WN_x$ (which is conventionally used as the diffusion barrier layer) does not occur. Thus, it is possible to prevent the gate from being unevenly etched and to inhibit loss of gate oxidation.

Finally, since there are no pores in the tungsten structure, a uniform gate line is formed and thus line resistance distribution becomes uniform, thereby improving uniformity.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art.

What is claimed is:

1. A method for forming a gate electrode of a semiconductor device comprising:

sequentially forming a first insulating film, a polysilicon layer and a tungsten layer on a semiconductor substrate;

doping oxygen in the tungsten layer;

forming a second insulating film on the tungsten layer to which oxygen is added; and selectively removing the second insulating film, the tungsten layer, the polysilicon layer and the first insulating film to form a gate electrode.

2. The method of claim 1, further comprising selectively oxidizing the gate electrode.

3. The method of claim 2, wherein selectively oxidizing the gate electrode is performed at a temperature of 800~1000° C. at the ambient of $H_2O/H_2$.

4. The method of claim 3, wherein a voltage dividing ratio of the $H_2O/H_2$ is $10^{-6}$~1.

5. The method of claim 2, wherein argon gas and nitrogen gas are used as carrier gases while selectively oxidizing the gate electrode.

6. The method of claim 1, wherein the tungsten layer to which oxygen is added is formed by an annealing process in an ambient of $H_2O/H_2$.

7. The method of claim 6, wherein the annealing process is performed with a voltage dividing ratio of $H_2O/H_2$ corresponding to $10^{-6}$1 at a temperature of 600~1000° C.

8. The method of claim 6, wherein the annealing process is performed by adding one of $N_2$ and $NH_3$ to the tungsten layer such that nitrogen is further added to the tungsten layer.

9. The method of claim 1, wherein oxygen is added to the tungsten layer by an oxygen ion implantation process.

10. The method of claim 1, wherein oxygen is added to the tungsten layer using oxygen plasma.

11. A method for forming a gate electrode of a semiconductor device comprising the steps of:

sequentially forming a first insulating film and a polysilicon layer on a semiconductor substrate;

forming a tungsten layer to which oxygen is added by sputtering in such a manner that oxygen gas is added to a reaction gas;

forming a second insulating film on the tungsten layer to which oxygen is added; and selectively removing the second insulating film, the tungsten layer, the polysilicon layer and the first insulating film to form a gate electrode.

12. The method of claim 11, wherein the tungsten layer is formed by adding oxygen gas of 5% or less concentration to the reaction gas.

13. The method of claim 11, wherein the reaction gas includes argon gas.

14. The method of claim 11, the tungsten layer is formed by further adding nitrogen gas to the reaction gas.

* * * * *